(12) United States Patent
Kim et al.

(10) Patent No.: US 11,481,042 B2
(45) Date of Patent: Oct. 25, 2022

(54) TOUCH SENSING DEVICE AND ELECTRONIC DEVICE INCLUDING TOUCH SENSING DEVICE

(71) Applicant: SAMSUNG ELECTRO-MECHANICS CO., LTD., Suwon-si (KR)

(72) Inventors: Jong Yun Kim, Suwon-si (KR); Gye Won Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 167 days.

(21) Appl. No.: 17/032,590

(22) Filed: Sep. 25, 2020

(65) Prior Publication Data
US 2022/0011872 A1  Jan. 13, 2022

(30) Foreign Application Priority Data
Jul. 7, 2020  (KR) .................. 10-2020-0083284

(51) Int. Cl.
| | |
|---|---|
| G09G 5/00 | (2006.01) |
| G06F 3/02 | (2006.01) |
| G01D 5/20 | (2006.01) |
| G01L 1/12 | (2006.01) |
| H03K 17/96 | (2006.01) |

(52) U.S. Cl.
CPC ............ G06F 3/0202 (2013.01); G01D 5/20 (2013.01); G01L 1/127 (2013.01); H03K 17/96 (2013.01)

(58) Field of Classification Search
CPC ......... G01D 5/20; G01L 1/127; G06F 1/1626; G06F 1/1656; G06F 1/169; G06F 2203/0339; G06F 3/0202; H03K 17/96; H03K 17/97; H03K 2217/96015; H03K 2217/9651; H04M 1/236; H04M 2250/22
See application file for complete search history.

(56) References Cited

U.S. PATENT DOCUMENTS

| | | | |
|---|---|---|---|
| 10,466,829 B2 | 11/2019 | Filiz et al. | |
| 2012/0073866 A1 | 3/2012 | Hirai et al. | |
| 2012/0306798 A1 | 12/2012 | Zoller et al. | |
| 2018/0052065 A1* | 2/2018 | Sipilä .................... | H01L 41/125 |
| 2019/0339776 A1* | 11/2019 | Rosenberg ............. | G06F 3/047 |

FOREIGN PATENT DOCUMENTS

| | | |
|---|---|---|
| JP | 2748079 B2 | 2/1998 |
| KR | 10-2012-0032734 A | 4/2012 |
| KR | 10-2012-0125278 A | 11/2012 |
| KR | 10-2014-0114141 | 9/2014 |
| KR | 10-2020-0000061 | 1/2020 |

OTHER PUBLICATIONS

Korean Office Action dated Oct. 26, 2021 in corresponding Korean Patent Application No. 10-2020-0083284. (9 pages in English and 7 pages in Korean).

* cited by examiner

*Primary Examiner* — Insa Sadio
(74) *Attorney, Agent, or Firm* — NSIP Law (57) ABSTRACT

A touch sensing device includes: a first sensing coil having conductivity; a second sensing coil having conductivity; a substrate having a space accommodating either one or both of the first sensing coil and the second sensing coil, wherein at least a portion of the substrate is disposed between the first sensing coil and the second sensing coil; and an elastic member configured to be compressed as external pressure is applied and the substrate descends.

18 Claims, 8 Drawing Sheets

TOUCH SENSING DEVICE AND ELECTRONIC DEVICE INCLUDING TOUCH SENSING DEVICE

CROSS-REFERENCE TO RELATED APPLICATIONS

This application claims the benefit under 35 USC § 119(a) of Korean Patent Application No. 10-2020-0083284 filed on Jul. 7, 2020 in the Korean Intellectual Property Office, the entire disclosure of which is incorporated herein by reference for all purposes.

BACKGROUND

1. Field

The following description relates to a touch operation sensing device, and an electronic device including a touch operation sensing device.

2. Description of Related Art

In general, it is preferable for wearable devices to have thinner, simpler, and sleeker, more elegant designs. Thus, existing mechanical switches are being implemented less frequently in wearable devices. Such designs are possible with the implementation of dustproofing and waterproofing technologies, as well as the development of models having a smooth designs and unity of construction.

Currently, a touch-on-metal (ToM) technology that implements touch inputs on metal, a capacitor sensing technology using a touch panel, a micro-electro-mechanical-system (MEMS), a micro strain gauge technology, and the like are being developed. Further, a force touch function is also being developed.

In the case of a conventional mechanical switch, a large size and space are required internally to implement the switch function, and a conventional mechanical switch may have a structure that is not integral with an external case, or may have a shape protruding outwardly, which causes a disadvantage of not being sleek or elegant, and taking up a lot of space.

In addition, there is a risk of electric shocks due to direct contact with a mechanical switch that is electrically connected, and in particular, there is a disadvantage that it may be difficult to implement dustproofing and waterproofing due to the structure of the mechanical switch.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a touch sensing device includes: a first sensing coil having conductivity; a second sensing coil having conductivity; a substrate having a space accommodating either one or both of the first sensing coil and the second sensing coil, wherein at least a portion of the substrate is disposed between the first sensing coil and the second sensing coil; and an elastic member configured to be compressed as external pressure is applied and the substrate descends.

The touch sensing device may further include a support member disposed to extend parallel to the substrate, and fixing the substrate.

At least a portion of the support member may be recessed, and the substrate may be fixed at a position including the recessed portion of the support member. The second sensing coil may be disposed on one surface of the substrate, and may be disposed in the recessed portion of the support member.

The touch sensing device may further include at least one pair of support-connecting members disposed such that one end of each of the support-connecting members is bonded to the support member, and the support-connecting members extend perpendicular to the support member. The first sensing coil and the second sensing coil may be disposed between the at least one pair of support-connecting members.

At least a portion of the elastic member may be disposed to overlap in at least a portion of the at least one pair of support-connecting members in a vertical direction.

The first sensing coil may be disposed on one surface of the substrate, and the second sensing coil may be disposed on another surface of the substrate. The first sensing coil and the second sensing coil may be electrically connected to each other.

The first sensing coil may be disposed on one surface of the substrate, and the second sensing coil may be disposed on another surface of the substrate. The first sensing coil and the second sensing coil may be disposed such that respective winding shafts of the first sensing coil and the second sensing coil are arranged to be staggered with respect to each other.

The first sensing coil and the second sensing coil may be disposed on a same surface of the substrate. The substrate may be bent such that the first sensing coil and the second sensing coil face each other.

In another general aspect, an electronic device includes: a housing including a touch switch portion in at least a portion of the housing; a lower frame spaced apart from a lower surface of the housing; and a touch sensing device disposed between the housing and the lower frame, and configured to sense external pressure applied to the touch switch portion. The touch sensing device includes: a first sensing coil having conductivity; a second sensing coil having conductivity; a substrate having a space accommodating either one or both of the first sensing coil and the second sensing coil, wherein at least a portion of the substrate is disposed between the first sensing coil and the second sensing coil; and a support-connecting member supporting the housing such that the substrate descends as external pressure is applied to the touch switch portion.

The electronic device may further include a sensing circuit unit electrically connected to the substrate, and configured to generate information of the external pressure, based on a sum of a change in inductance of the first sensing coil and a change in inductance of the second sensing coil.

The housing and the lower frame may be connected to each other at locations disposed around the first sensing coil and the second sensing coil.

The touch sensing device may further include a support member disposed to extend parallel to the substrate, and fixing the substrate.

At least a portion of the support member may be recessed, and the substrate may be fixed at a position including the recessed portion of the support member. The second sensing coil may be disposed on one surface of the substrate, and may be disposed in the recessed portion of the support member.

The support-connecting member may include at least one pair of support-connecting members disposed such that one end of each of the support-connecting members is bonded to the support member, another end of each of the support-connecting members is bonded to the housing, and the support-connecting members extend perpendicular to the support member. The first sensing coil and the second sensing coil may be disposed between the at least one pair of support-connecting members.

The electronic device may further include an elastic member disposed between the lower frame and the substrate.

The first sensing coil may be disposed on one surface of the substrate, and the second sensing coil may be disposed on another surface the substrate. The first sensing coil and the second sensing coil may be electrically connected to each other.

The first sensing coil may be disposed on one surface of the substrate, and the second sensing coil may be disposed on another surface of the substrate. The first sensing coil and the second sensing coil may be disposed such that respective winding shafts of the first sensing coil and the second sensing coil are arranged to be staggered with respect to each other.

The first sensing coil and the second sensing coil may be disposed on a same surface of the substrate. The substrate may be bent such that the first sensing coil and the second sensing coil face each other.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Figure 1:
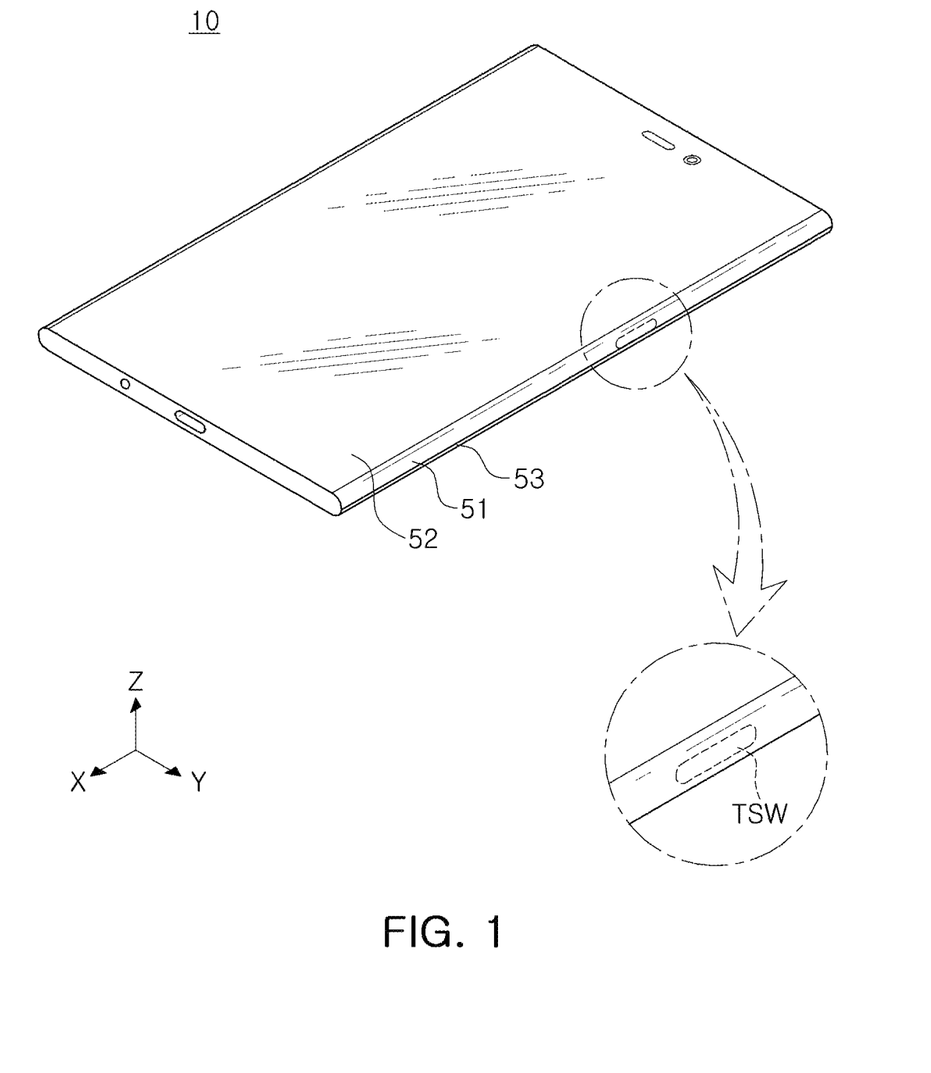
FIG. 1 is a view of an appearance of an electronic device, according to an embodiment.

FIG. 1 is a view of an appearance of an electronic device 10, according to an embodiment.

Referring to FIG. 1, the electronic device 10 may include, for example, a housing 51, a front display glass 52, a rear cover 53, and a touch switch portion TSW.

The housing 51 may be a structure for covering at least a portion of the electronic device 10, and may be integrally formed with a structure forming a central framework of the electronic device 10. The housing 51 may be formed of various materials according to the type and configuration of the electronic device 10. For example, when the electronic device 10 is a smartphone as illustrated in FIG. 1 by way of example, the housing 51 may be formed of a material of a metal frame. Alternatively, the housing 51 may also be formed of a non-conductive material such as glass.

The front display glass 52 may be disposed on one side of the housing 51, and the rear cover 53 may be disposed on another, opposite side of the housing 51. That is, the electronic device 10 may include a side surface having a two layer structure or a three-layer structure composed of the front display glass 52, the housing 51, and the rear cover 53.

The touch switch portion TSW may be a portion formed on the side surface of the electronic device 10 to replace a mechanical button. The touch switch portion TSW may be a portion to which a touch input is applied. For example, the touch switch portion TSW may be a contact surface to which pressure is applied by a user's hand. In addition, referring to FIG. 1, the touch switch portion TSW may correspond to at least a portion of the housing 51.

Referring to FIG. 1, the electronic device 10 may be a portable device such as a smartphone, or the like, and may be a wearable device such as a smartwatch. However, the electronic device 10 is not limited to a specific device, and the electronic device 10 may be a portable or wearable electronic device, or an electronic device having a switch for controlling an operation.

For example, the electronic device 10 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like, but is not limited to such examples.

In an electronic device such as a general mobile phone, a volume button or a power button may be formed on the side surface thereof as a physical button (key). In this case, the physical button may protrude outwardly such that the physical button can be pressed with a user's hand. However, when using a physical button, there is a durability lifespan issue caused by wear and the like, and there is a limitation that it is difficult to waterproof the physical button.

To compensate for this disadvantage, a touch sensing switch has been developed, but the conventional touch sensing switch has a limitation in that the sensitivity of a sensor is deteriorated because a change in inductance of the sensor is not large compared to the pressure applied to the touch sensing switch by the user. In addition, there is a limitation in that a malfunction may occur because when an unintended touch by the user and pressure intentionally applied for the force touch input are not clearly distinguished.

Embodiments proposed to address the aforementioned limitations will be described with reference to FIGS. 2A to 9.

For each drawing of this disclosure, unnecessarily duplicated descriptions may be omitted for the same reference numerals and components having the same function, and possible differences for each drawing may be described.

Figure 2A:
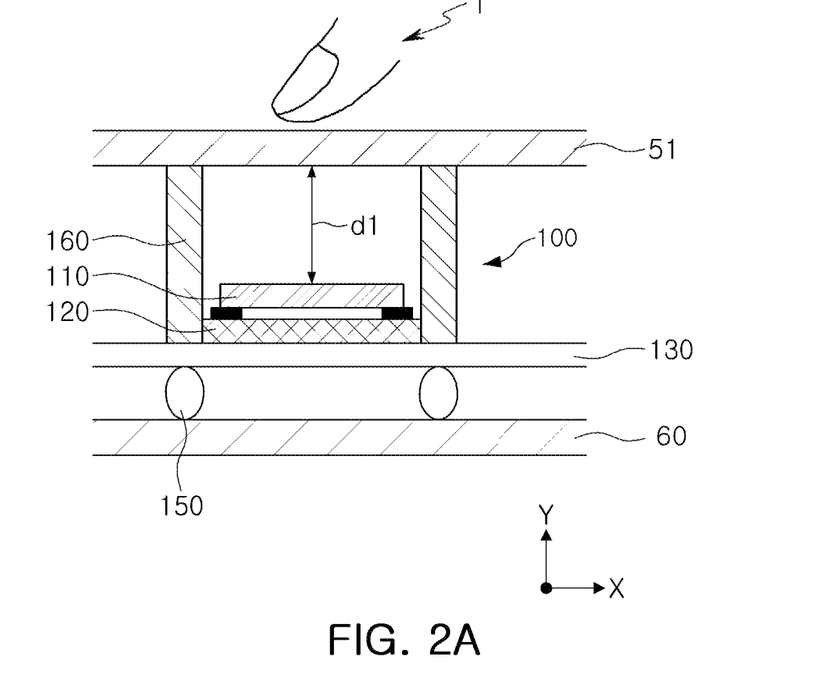
FIG. 2A is a view of a structure of the electronic device in which a second sensing coil is not provided in a touch sensing device, according to an embodiment.
Figure 2B:
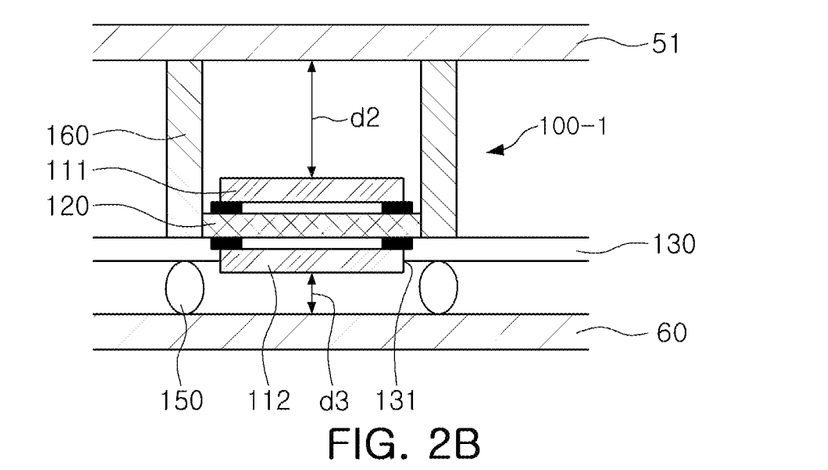
FIG. 2B is a view of a structure of the electronic device in which a second sensing coil is provided in a touch sensing device, according to an embodiment.

FIG. 2A a view of a structure of an electronic device 10 including a touch sensing device 100 in which a second sensing coil is not provided, according to an embodiment. FIG. 2B is a view of a structure of the electronic device 10, in which a second sensing coil 112 is provided in a touch sensing device 100-1, according to an embodiment.

Referring to FIGS. 1 and 2A, an example concept of the disclosure herein is to sense a degree of bending of the housing 51 inwardly when pressure is applied to the touch switch portion TSW with a user's hand 1, to enable a touch input without physical buttons.

The front display glass 52 may be disposed above the housing 51, and the rear cover 53 may be disposed below the housing 51. In this case, the rear cover 53 may be, for example, a back glass. For example, referring to FIGS. 1, 2A, and 2B, the housing 51 may include the touch switch portion TSW in at least a portion of the housing 51. In addition, the electronic device 10 may further include a lower frame 60. The lower frame 60 may be made of a conductive or non-conductive material, and is not limited to a special shape or structure. The lower frame 60 may be disposed to be spaced apart from the housing 51 while having one surface parallel to the lower surface of the housing 51. That is, the housing 51 and the lower frame 60 may have respective surfaces disposed parallel to each other, and an internal space may be formed between the respective surfaces parallel to each other.

In addition, referring to FIG. 2A, the electronic device 10 may include a touch sensing device 100, and the touch sensing device 100 may be disposed between the housing 51 and the lower frame 60. The touch sensing device 100 may sense external pressure applied to the touch switch portion TSW of the housing 51. For example, the touch sensing device 100 may include a sensing coil 110, a substrate 120, a support member 130, an elastic member 150, and a support-connecting member 160.

The touch sensing device 100 is a device capable of detecting a touch input. For reference, in this disclosure, a touch, a touch input, and touch application include a contact touch that makes contact without force, and a force touch that involves a force by a pressing action (pressure). For example, the disclosure herein focuses on the force touch input by inductive sensing. In addition, hereinafter, the force input means an input by a force touch to which pressure is applied, among touch inputs.

More specifically, referring to FIG. 2A, force may be applied to the touch switch portion TSW of the housing 51 by the user's hand 1. Accordingly, the housing 51 may be bent inwardly around the position of the touch switch portion TSW, and a change in a size of an air gap formed between the touch sensing device 100 and the housing 51 may be caused.

In this case, when the size of the air gap changes, the inductance changes. Therefore, when the change in inductance of a reference value or more is detected, the touch sensing device 100 may detect that a force touch input is applied to the touch switch portion TSW.

Referring to FIG. 2B, the touch sensing device 100-1 may have a configuration such that sensitivity of the touch sensing device 100-1 may be improved with respect to the touch sensing device 100 of FIG. 2A. That is, as illustrated in FIG. 2B, a first sensing coil 111 and a second sensing coil 112 may be simultaneously provided in the touch sensing device 100-1.

As illustrated in FIG. 2B, the housing 51 and the lower frame 60 may be connected to each other by bypassing the first sensing coil 111 and the second sensing coil 112. That is, by forming a region around the first sensing coil 111 and the second sensing coil 112 in which the housing 51 and the lower frame 60 are in contact with each other, it may be possible to form a framework of the electronic device 10 as a whole.

Referring to FIGS. 1 and 2B, when the touch sensing device 100-1 is inserted into the electronic device 10, the first sensing coil 111, the second sensing coil 112, the substrate 120, and the support member 130 may be disposed to extend parallel to an inner side surface of the housing 51. In this case, the first sensing coil 111 of the touch sensing device 100-1 is installed to be spaced apart from the housing 51, and an air gap having a length d2 may be formed between the first sensing coil 111 and the housing 51. In addition, the second sensing coil 112 may be installed to be spaced apart from the lower frame 60, and an air gap having a length d3 may be formed between the second sensing coil 112 and the lower frame 60.

Thus, in contrast to the touch sensing device 100 of FIG. 2A, in which the single sensing coil 110 is provided and a single air gap having a length d1 is formed between the sensing coil 110 and the housing 51, the touch sensing device 100-1 of FIG. 2B includes the first and second sensing coils 111 and 112, and the plurality of air gaps having respective lengths d2 and d3.

The first sensing coil 111 and the second sensing coil 112 have conductivity, and the second sensing coil 112 may be disposed to face an opposite direction to the first sensing coil 111. For example, as shown in FIG. 2B, the first sensing coil 111 may be disposed to face the lower surface of the housing 51, and the second sensing coil 112 may be disposed to face the upper surface of the lower frame 60.

The shapes of the first sensing coil 111 and the second sensing coil 112 are not particularly limited, and a coil pattern of the first and second sensing coils 111 and 112 may be formed in various shapes such as a circle, a square, or the like. In addition, it is also possible to form each of the sensing coils 111 and 112 in a form of a wiring pattern on a PCB or an FPCB, or to configure the first and second sensing coils 111 and 112 in a form of a chip inductor.

The touch sensing device 100-1 may detect that the housing 51 is deformed by the force of the user's hand 1 pressing the touch switch portion TSW. That is, when the user's hand 1 presses the touch switch portion TSW, the housing 51 is bent towards the sensing coil 110, and accordingly, a length d2 of the gap between the first sensing coil 111 and the housing 51 changes.

In this case, pressure may also be delivered to the elastic member 150 located at a lowermost portion of the touch sensing device 100-1 such that the elastic member 150 is compressed. As the elastic member 150 is compressed, a structure including the first sensing coil 111, the second sensing coil 112, the substrate 120, and the support member 130 may descend together. Then, a length d3 of the gap between the second sensing coil 112 and the lower frame 60 is changed. That is, as pressure is applied to the housing 51, the lengths d2 and d3 may be changed in a direction in which the lengths d2 and d3 simultaneously decrease.

A structure corresponding to a state in which lengths d2 and d3 are changed as a result of the external pressure being applied by the user, and an effect of the change in the lengths d2 and d3, will be described later in more detail with respect to FIG. 4.

The housing 51 and the lower frame 60 may be made of the same material or different materials. For example, the housing 51 and the lower frame 60 may be made of aluminum or other metal. As an example, the housing 51 and the lower frame 60 are conductors surrounding the first sensing coil 111 and the second sensing coil 112. Thus, while a current flows through the first sensing coil 111 and the second sensing coil 112, the distance d2 between the housing 51 and the first sensing coil 111, and the distance d3 between the lower frame 60 and the second sensing coil 112 may be changed to generate an eddy current. By the eddy current being generated according to the change in distances, a change in inductance of the first sensing coil 111 and the second sensing coil 112 occurs.

In addition, a resonance frequency may change according to the change in inductance. The touch sensing device 100-1 may detect a change in pressure applied to the touch switch portion TSW based on the above-described change in the resonance frequency, and recognize the change in pressure as a force touch input. In other words, the first sensing coil 111 and the second sensing coil 112 may function as inductors, so that the touch sensing device 100-1 may sense external pressure as an input applied to the electronic device 10.

Referring to FIG. 2B, the substrate 120 may have at least one dispositional space of the first sensing coil 111 and the second sensing coil 112, and at least a portion of the substrate 120 may be disposed between the first sensing coil 111 and the second sensing coil 112. The substrate 120 may be an FPCB, but is not limited thereto. That is, various types of substrates 120 having a structure in which at least one metal layer and at least one wiring layer are alternately stacked, other than the FPCB, may all be used.

According to an embodiment of the present disclosure, the first sensing coil 111 may be disposed on one surface of the substrate 120, and the second sensing coil 112 may be disposed on the other surface of the substrate 120. That is, the first sensing coil 111 and the second sensing coil 112 may be simultaneously disposed on both surfaces of the substrate 120.

FIG. 2B illustrates an embodiment in which only one first sensing coil 111 and one second sensing coil 112 are provided. However, a plurality of first sensing coils 111 and a plurality of second sensing coils 112 may also be provided together. That is, as the electronic device 10 may include a plurality of touch switch portions TSW, a sensing structure including the first sensing coil 111 and the second sensing coil 112 may be repeatedly arranged in the electronic device 10.

The support member 130 may form a framework of the touch sensing device 100-1 so that the touch sensing device 100 can be inserted into the electronic device 10. In this case, the support member 130 may be disposed to be parallel to the substrate 120, and may fix the substrate 120. That is, the support member 130 is fixed to an interior of the housing 51, and the substrate 120 may be disposed on the upper surface of the support member 130, so that the substrate 120 may be installed inside the housing 51.

The support member 130 may be implemented in various configurations, depending on the type of the electronic device 10 and the shape of the internal structure of the electronic device 10, and is not limited to a particular shape or structure. That is, as illustrated in FIG. 2B, the substrate 120 may include a uniformly flat structure in at least some regions so that the substrate 120 may be disposed to extend parallel to the housing 51 and the lower frame 60.

The touch sensing device 100-1 including the support member 130 may be inserted into the electronic device 10. The support member 130 may be implemented to be detachable from an internal structure of the electronic device 10, such as the housing 51 and the lower frame 60.

Referring to FIG. 2B, the support member 130 may include a recessed region 131. That is, at least a portion of the support member 130 may be recessed.

The substrate 120 may be fixed at a position including the recessed region 131. In this case, a first sensing coil 111 may be disposed on the one surface of the substrate 120, and the support member 130 and the second sensing coil 112 may be disposed on the other surface of the support member 130. That is, as illustrated in FIG. 2B, the second sensing coil 112 may be disposed in the recessed region 131 corresponding to a recessed area of the support member 130. By the substrate 120 being disposed as described above, even if one surface of the substrate 120 is in contact with the support member 130, the second sensing coil 112 may be directly mounted on the substrate 120.

The elastic member 150 may be disposed to be compressed as external pressure is applied and the substrate 120 descends. That is, referring to FIG. 2B, the elastic member 150 may be provided at a lowermost portion of the force sensing device 100 and, accordingly, may be bonded to the lower frame 60. When external pressure is applied to the housing 51, the elastic member 150 may be compressed to decrease a length of the elastic member 150 in a vertical direction.

The elastic member 150 may be formed of various materials that can be compressed by pressure. Referring to FIG. 2B, since the support member 130 and the housing 51 are connected through the support-connecting member 160, when pressure is applied to the housing 51, the pressure may be delivered to the elastic member 150, which is located on below the support member 130. For example, at least a portion of the elastic member 150 may be disposed to overlap the support-connecting member 160 in a vertical direction.

By providing the elastic member 150 below the support member 130, the elastic member 150 may be compressed to increase a degree of bending of the housing 51. Then, the distance d2 between the housing 51 and the first sensing coil 111 may be reduced at a higher rate than when the elastic member 150 is not provided.

In addition, as the elastic member 150 is compressed, a structure including the first sensing coil 111, the second sensing coil 112, the substrate 120, and the support member 130 may descend together, thereby also reducing the distance d3 between the second sensing coil 112 and the lower frame 60.

As described above, by providing the elastic member 150 in the touch sensing device 100-1, a change amount of inductance generated in the first sensing coil 111 may increase, and at the same time, a change in inductance of the second sensing coil 112 may also occur. That is, as pressure is applied to the housing 51, since the change in inductance increased simultaneously in the first sensing coil 111 and the second sensing coil 112 is detected, sensitivity of the sensor can be improved.

Referring to FIG. 2B, the touch sensing device 100-1 may include at least one pair of support-connecting members 160. The one pair of support-connecting members 160 may be installed such that one end of each of the support-connecting members 160 is bonded to the support member 130 and the other end of each of the support-connecting members 160 is bonded to the housing 51, and the support-connecting members 160 extend perpendicular to the support member 130. At least a portion of the elastic member 150 may be disposed to overlap the at least one pair of support-connecting members 160 in a vertical direction.

In this example, the first sensing coil 111 and the second sensing coil 112 may be disposed between the at least one pair of support-connecting members 160. In other words, the at least one pair of support-connecting members 160 may be installed on the sides of the substrate 120 on which the first sensing coil 111 and the second sensing coil 112 are disposed, respectively, and may partition a space in a form of a column or a wall.

When a user applies pressure to the touch switch portion TSW of the housing 51, the support-connecting member 160 may allow some regions of the housing 51 to be easily bent inwardly. That is, the support-connecting member 160 may perform a function of setting deformation boundary points on both sides thereof so that the housing 51 may be bent around a point at which the pressure is applied by the user's hand 1.

In addition, because at least a portion of the elastic member 150 may be disposed to overlap at least a portion of the support-connecting member 160 in the vertical direction, the pressure applied to the housing 51 may be concentrated and delivered to the elastic member 150 through the support-connecting member 160. That is, the support-connecting member 160 may perform a function of assisting the compression of the elastic member 150.

For reference, the support-connecting member 160 may be made of various conductive or non-conductive materials. That is, since it is sufficient that the support-connecting member 160 performs a function of a deformation boundary point in a form of a column or a wall as the user applies pressure to the housing 51, it is irrelevant if the support-connecting member 160 is made of an insulator. However, since the structure of the support-connecting member 160 must be maintained despite the pressure applied thereto and the deformation of the housing 51, it is desirable to form the support-connecting member 160 of a material having high strength. In addition, since the support-connecting member 160 is a component installed in the electronic device 10, it may be desirable to use a lightweight material for the support-connecting member 160.

Figure 3:
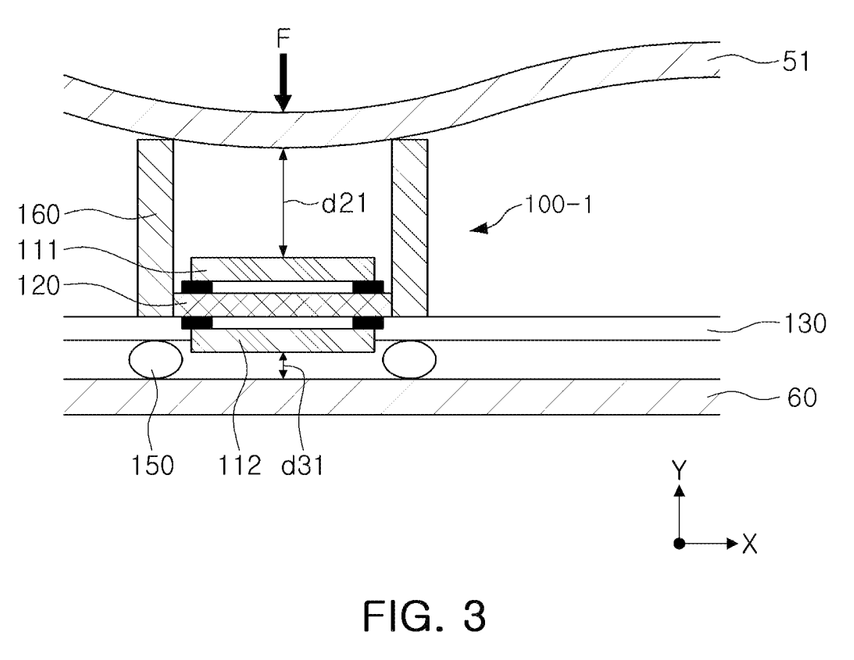
FIG. 3 is a view of a state in which external pressure is applied to a housing of FIG. 2B.

FIG. 3 is a view of a state in which external pressure is applied to the housing 51 in FIG. 2B, according to an embodiment.

Referring to FIG. 2B and FIG. 3 together, deformation of the housing 51 may occur as illustrated in FIG. 3 when external pressure F is applied to the housing 51. That is, the housing 51 is bent inwardly (downwardly in FIG. 3) around the touch switch portion TSW, which is a point at which pressure is directly applied to the housing 51.

For example, the housing 51 is made of a material having ductility, and thus can easily deform as the user applies pressure thereto. In addition, by being made of a material having elasticity, the housing 51 may be easily returned to its original position after the deformation. For example, the housing 51 may be made of various metals, or may be made of alloys in which metal materials such as soft iron, tungsten, phosphor bronze, chromoly, and the like, are added.

Contrary to FIG. 2B, which illustrates a state before the deformation of the housing 51, FIG. 3 illustrates a state after the deformation of the housing 51, in which the length of the air gap between the housing 51 and the first sensing coil 111 is reduced from d2 to d1. In addition, as described above, the elastic member 150 may be further provided, such that the air gap between the housing 51 and the first sensing coil 111 may be reduced at a higher rate than when the elastic member 150 is not provided.

As the housing 51 is deformed as illustrated in FIG. 3, the elastic member 150 is compressed, and, accordingly, the length of the air gap between the lower frame 60 and the second sensing coil 112 is also reduced from d3 to d31. That is, the first and second sensing coils 111 and 112 may be provided together, so that a change in inductance can occur simultaneously in each of the first and second sensing coils 111 and 112. Then, the total change amount of inductance may be maximized, so that the sensing sensitivity of the touch sensing device 100-1 may be improved.

As an example, when the housing 51 is made of a metal material, while a current flows simultaneously through the first sensing coil 111 and the second sensing coil 112, the distance d2 between the first sensing coil 111 and the housing 51 and the distance between the second sensing coil 112 and the lower frame 60 may be reduced to generate an eddy current. By the eddy current being generated according to the changes in distance, the changes in inductance and the change in resonance frequency of the first sensing coil 111 and the second sensing coil 112 are generated.

In this case, a sensing circuit unit 200 (FIG. 4) may determine whether the corresponding pressing operation is a normal force input, based on the change in inductance and the change in resonance frequency. That is, when the change in inductance and the change in resonance frequency are changes according to a result of a rapid decrease in the air gap, the corresponding pressing operation can be recognized as a force input applied to the touch switch portion TSW.

In addition, even if pressure is applied to the touch switch portion TSW of the housing 51 as illustrated in FIG. 3, the applied pressure may be detected as a normal force input only when a size of the applied pressure exceeds a preset reference value. That is, a user may unintentionally touch the touch switch portion TSW while carrying the electronic device 10. Therefore, the sensing circuit unit 200 may determine that external pressure is normally applied to the switch portion TSW, when the distance between the first sensing coil 111 and the housing 51, and the distance between the second sensing coil 112 and the lower frame 60 are reduced by an amount exceeding a reference value of a preset change amount.

Figure 4:
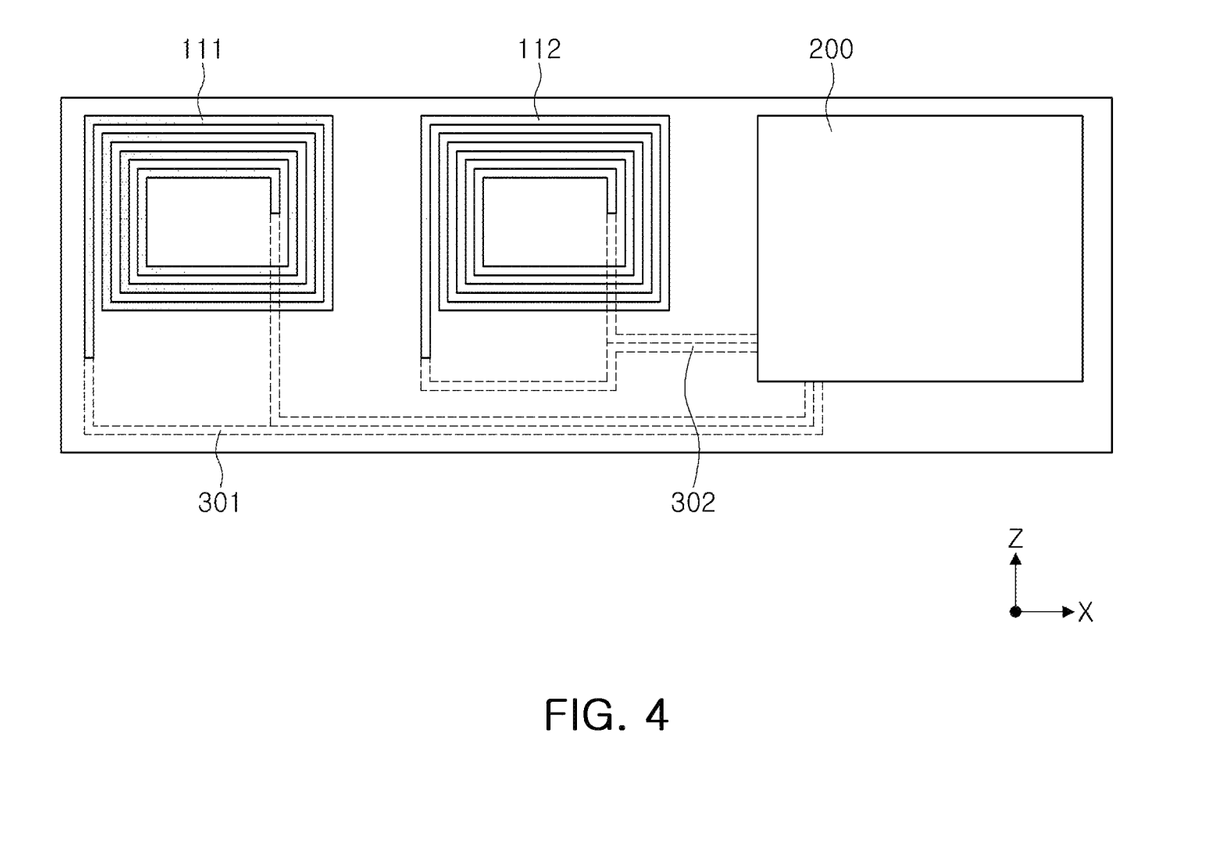
FIG. 4 is a view in which a first sensing coil and the second sensing coil are connected to one sensing circuit unit.

FIG. 4 is a view in which the first sensing coil 111 and the second sensing coil 112 are connected to one sensing circuit unit 200, according to an embodiment.

Referring to FIG. 4, the force sensing device 100-1 may include the sensing circuit unit 200. The sensing circuit unit 200 may be connected to the first sensing coil 111 and the second sensing coil 112 to detect application of external pressure. In this case, as illustrated in FIG. 4, the first sensing coil 111 and the sensing circuit unit 200 may be electrically connected through a first circuit connection portion 301, and the second sensing coil 112 and the sensing circuit unit 200 may be electrically connected through a second circuit connection portion 302.

The sensing circuit unit 200 may be a sensor IC (an integrated circuit). The sensing circuit unit 200 may detect the application of external pressure based on the change in inductance of the first and second sensing coils 111 and 112.

For example, when pressure is applied to the housing 51, the distance between the housing 51 and the first sensing coil 111 and the distance between the lower frame 60 and the second sensing coil 112 may change, such that an eddy current may be generated. Accordingly, a change may occur in the inductance of each of the first and second sensing coils 111 and 112. The sensing circuit unit 200 may detect a change in resonance frequency from the above-described change in inductance, and accordingly, may recognize that a force input is applied to the touch switch portion TSW.

That is, the sensing circuit unit 200 may generate external pressure information of the touch switch portion TSW, based on a sum of the change in inductance of the first sensing coil 111 and the change in inductance of the second sensing coil 112.

The first sensing coil 111 and the second sensing coil 112 may be connected to the one sensing circuit unit 200, as illustrated in FIG. 4. However, the first sensing coil 111 and the second sensing coil 112 may be connected to separate sensing circuit units 201 and 202, respectively.

Figure 5:
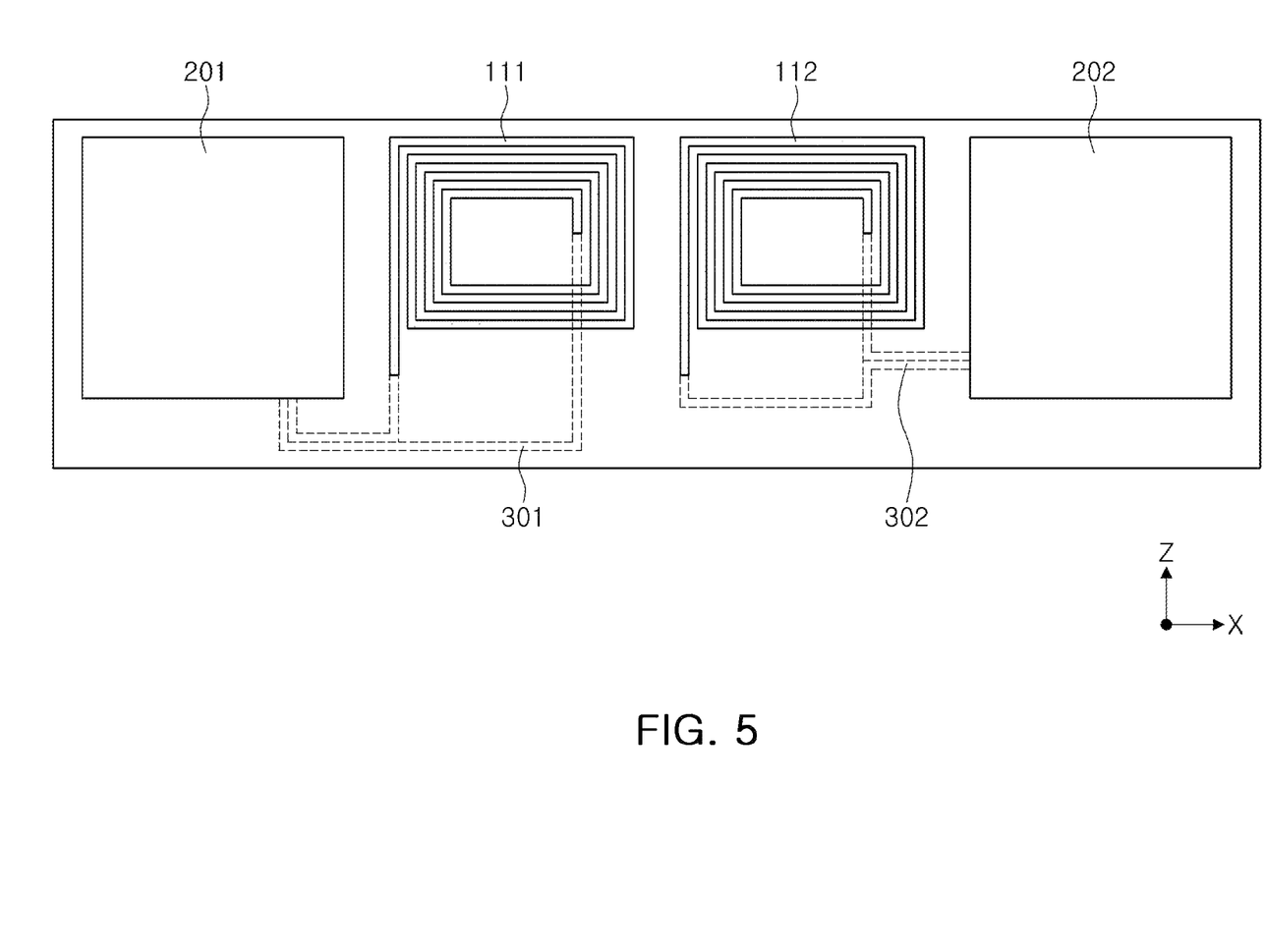
FIG. 5 is a view of a touch sensing device in which the first sensing coil and the second sensing coil are connected to separate sensing circuit units, respectively.

FIG. 5 is a view in which the first sensing coil 111 and the second sensing coil 112 are respectively connected to separate sensing circuit units 201 and 202, according to an embodiment.

Referring to FIG. 5, the first sensing coil 111 may be connected to the first sensing circuit unit 201 through a first circuit connection portion 301, and the second sensing coil 112 may be connected to the second sensing circuit unit 202 through a second circuit connection portion 302. As described above, the first and second sensing coils 111 and 112 may be respectively connected to the separate sensing circuit units 201 and 202, to function as a separate touch sensing devices, respectively.

For example, the first sensing circuit unit 201 may detect only a change in inductance as the distance between the first sensing coil 111 and the housing 51 changes. In addition, the second sensing circuit unit 202 may detect only a change in inductance as the distance between the second sensing coil 112 and the lower frame 60 changes.

Figure 9A:
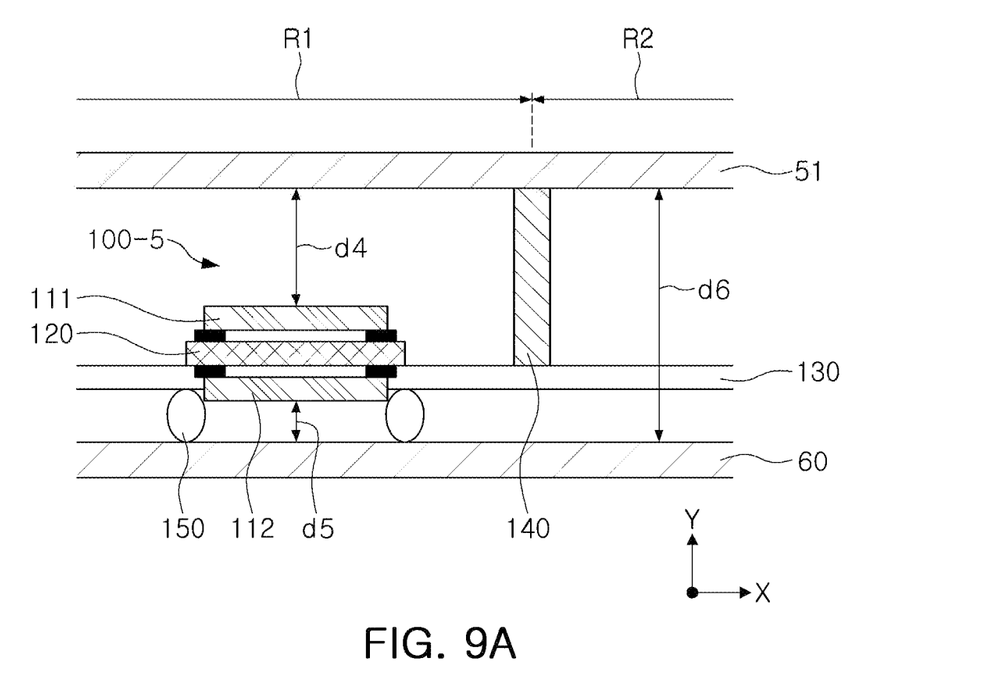
FIG. 9A is a view in which a deformation inducing shaft is provided in a touch sensing device, according to an embodiment.
Figure 9B:
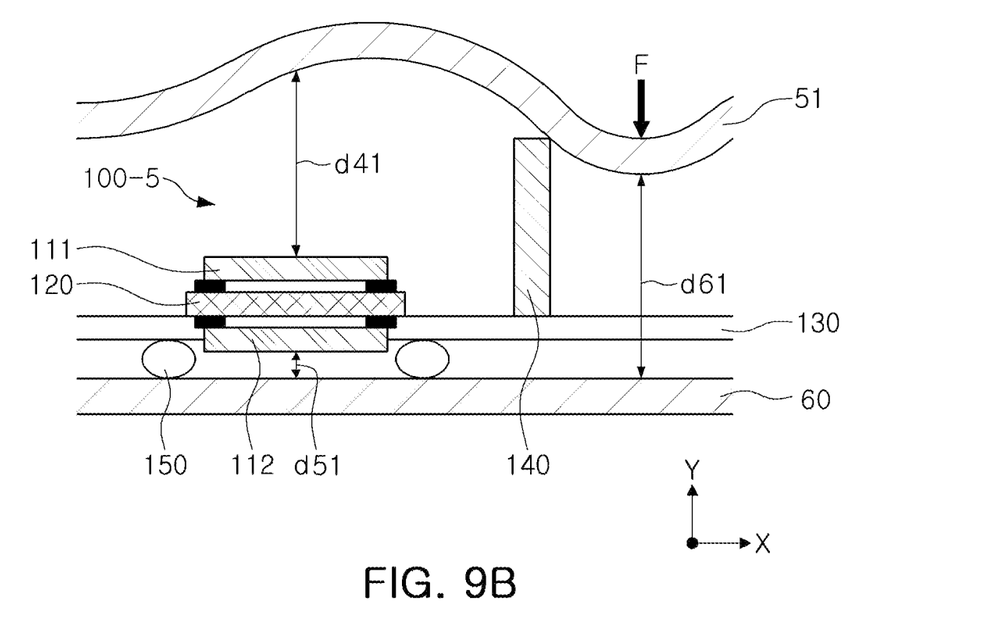
FIG. 9B is a view in which external pressure is applied to a housing of FIG. 9A.

The structure of FIG. 5 may be easily utilized when the first sensing circuit unit 201 and the second sensing circuit unit 202 detect the application of pressure in different manners from each other. In particular, as illustrated in FIGS. 9A and 9B, the structure of FIG. 5 may be utilized when implementing an embodiment to which the configuration of a deformation inducing shaft 140 is added. FIGS. 9A and 9B will be described later in more detail.

Figure 6:
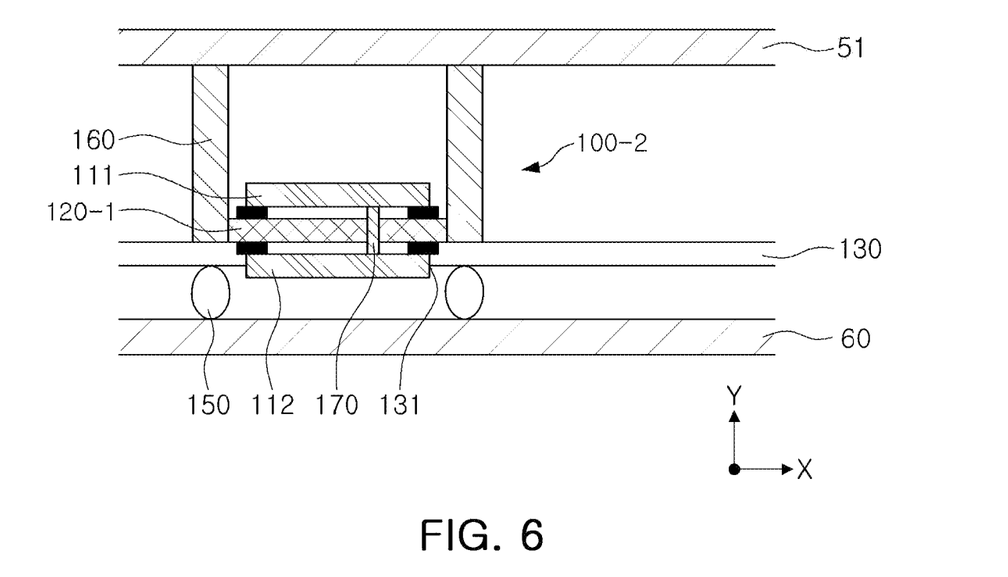
FIG. 6 is a view of a touch sensing device including a coil connection portion, according to an embodiment.
Figure 7:
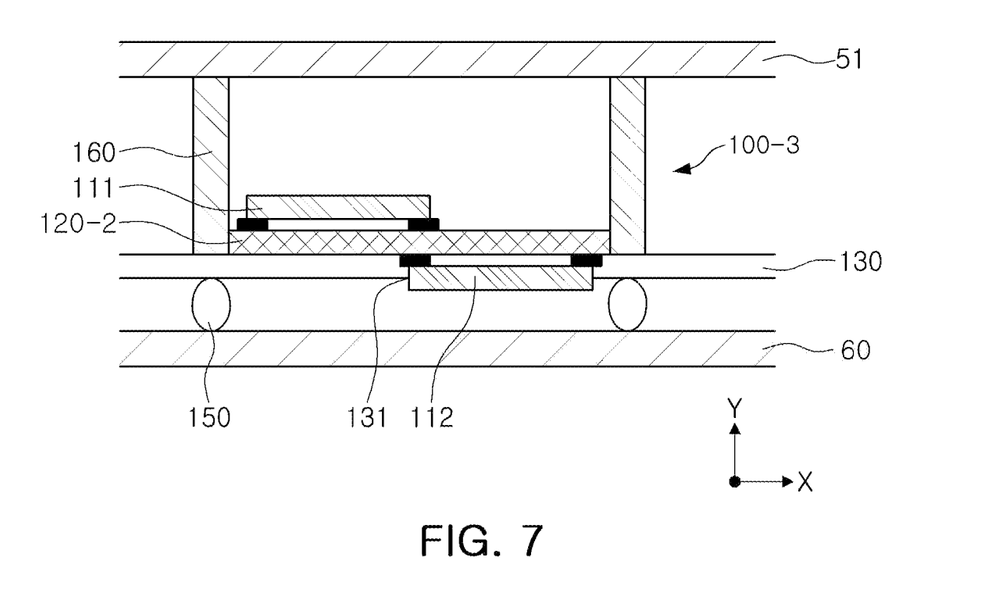
FIG. 7 is a view in which the first sensing coil and the second sensing coil are disposed at staggered positions on a substrate, according to an embodiment.
Figure 8:
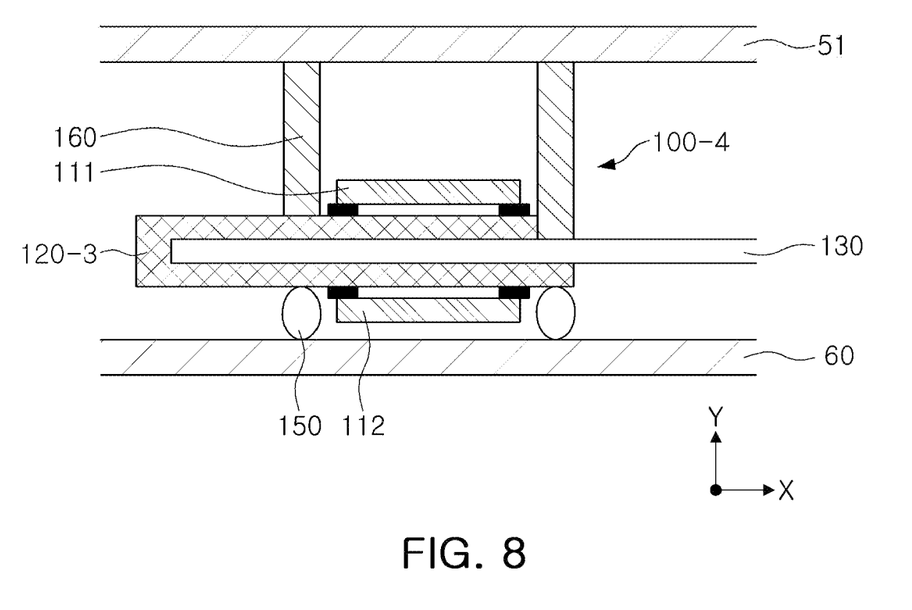
FIG. 8 is a view of a touch sensing device including a substrate, of which at least some regions are flexible, according to an embodiment.

FIGS. 6 to 8 illustrate additional embodiments having various layouts of the first and second sensing coils 111 and 112, in force sensing devices 100-2, 100-3, and 100-4 having the first sensing coil 111 and the second sensing coil 112.

FIG. 6 is a view in which a coil connection portion 170 is provided in a touch sensing device 100-2, according to an embodiment. FIG. 7 is a view of a touch sensing device 100-3 in which the first sensing coil 111 and the second sensing coil 112 are disposed at staggered positions on a substrate 120-2, according to an embodiment. FIG. 8 is a view of a touch sensing device 100-4 including a substrate 120-3 of which at least a portion is flexible, according to an embodiment.

Referring to FIG. 6, in the touch sensing device 100-2, the first sensing coil 111 may be disposed on one surface of a substrate 120-1 and a second sensing coil 112 may be disposed on the other surface of the substrate 120-1, and the first sensing coil 111 and the second sensing coil 112 may be electrically connected to each other through the substrate 120-1. That is, as illustrated in FIG. 6, the touch sensing device 100 may further include the coil connection portion 170.

The coil connection portion 170 has a configuration electrically connecting the first sensing coil 111 and the second sensing coil 112 to each other, and allows serial or parallel connection between both sensing coils 111 and 112. That is, the first sensing coil 111 and the second sensing coil 112 may be implemented as if they were one sensing coil. Accordingly, even if a connection is made to the sensing circuit unit 200 for only one of the first sensing coil 111 and the second sensing coil 112, the change in inductance occurring in both sensing coils 111 and 112 may be simultaneously detected in the corresponding sensing circuit unit 200.

In addition, by connecting the first sensing coil 111 and the second sensing coil 112 to each other through the coil connection unit 170 as described above, the amount of change in the inductance can be increased even if an inductor occupying a large space is not used. That is, it is possible to further increase the efficiency of the sensor in preparation based on the space occupied by the sensing coil 110 of FIG. 2A.

Referring to FIG. 7, in the touch sensing device 100-3, the first sensing coil 111 may be disposed on one surface of a substrate 120-2, and the second sensing coil 112 may be disposed on the other surface of the substrate 120-2. The first sensing coil 111 and the second sensing coil 112 may be disposed such that respective winding shafts of the first sensing coil 111 and the second sensing coil 112 are arranged to be staggered with respect to each other. That is, the first sensing coil 111 and the second sensing coil 112 may be respectively disposed on both surfaces of the substrate 120-2, but may be disposed to be staggered without overlapping each other.

For example, by disposing the first and second sensing coils 111 and 112 as illustrated in FIG. 7, it is possible to more flexibly adjust a positional relationship with other components disposed on the same substrate 120-2.

Referring to FIG. 8, in the touch sensing device 100-4, the first sensing coil 111 and the second sensing coil 112 may be disposed on the same surface of a substrate 120-3. In addition, the substrate 120-3 is configured such that at least a portion of the substrate 120-3 is flexible, and the substrate 120-3 may be bent such that the first sensing coil 111 and the second sensing coil 112 face each other in opposite directions.

As described above, various types of flexible substrates, such as a PCB, an FPCB, and the like may be used for the substrate 120-3. In this case, the substrate 120-3 may be bent to have a double-ply structure, for example, as illustrated in FIG. 8. That is, the substrate 120-3 may be a single member integrally formed on both surfaces of the support member 130.

By using the flexible substrate 120-3 as described above, while having the first sensing coil 111 and the second sensing coil 112 disposed on the same surface of the substrate 120-3, the first sensing coil 111 and the second sensing coil 112 may be implemented to face different directions, respectively. That is, since the first and second sensing coils 111 and 112 may be mounted or patterned on the same surface of the substrate 120-3, and a separate process may not be performed for both surfaces of the substrate 120-3, respectively, a manufacturing process of the touch sensing device 100-4 may be simplified.

FIG. 9A is a view of a touch sensing device 100-5 including a deformation inducing shaft 140, according to an embodiment. FIG. 9B is a view of a state in which external pressure is applied to the housing 51 of FIG. 9A.

As illustrated in FIG. 9A, the touch sensing device 100-5 may include a deformation inducing shaft 140. In this case, the deformation inducing shaft 140 may be installed to be spaced apart from the first sensing coil 111, and may be formed in a form of a column or a wall to block one side of the first sensing coil 111.

The deformation inducing shaft 140 may be configured to function as a lever when the user applies pressure to the housing 51. For example, when the user's hand 1 presses the housing 51 at a specific point, the housing 51 is bent in an inward direction at a point at which the pressure is applied. In this case, the deformation inducing shaft 140 may function as a lever, such that the housing 51 is bent in an outward direction at a point opposite to the point pressed by the user, based on the deformation inducing shaft 140.

The deformation inducing shaft 140 may asymmetrically form spaces on both sides of the first sensing coil 111. For example, as illustrated in FIG. 9A, when the deformation inducing shaft 140 is installed on a right side of the first sensing coil 111, a space on the right side of the first sensing coil 111 is blocked. On the other hand, a space on a left side of the first sensing coil 111 in which the deformation inducing shaft 140 is not installed is not blocked. Therefore, one side of the first sensing coil 111 may be blocked in one direction, and the other side thereof may be opened in one direction, by the deformation inducing shaft 140.

The deformation inducing shaft 140 may not be provided on a side of the second sensing coil 112. As illustrated in FIG. 9A, the deformation inducing shaft 140 may extend vertically between the housing 51 and the support member 130, such that the elastic member 150 bonded to the lower surface of the support member 130 may be easily compressed. As the elastic member 150 is compressed, a change occurs in the inductance of the second sensing coil 112, so it may be preferable that the deformation inducing shaft 140 is not formed to extend below the support member 130.

In addition, as illustrated in FIG. 9A, a support-connecting member 160 may not be provided in the touch sensing device 100-5. As described above, the support-connecting member 160 assists in the deformation of the housing 51 around the point at which pressure is applied by the user. Since such a function may also be performed by the deformation inducing shaft 140, the support-connecting member 160 and the deformation inducing shaft 140 are not necessarily provided together.

Additionally, as with the support-connecting member 160, the deformation inducing shaft 140 may be composed of various conductive or non-conductive materials. That is, since it is sufficient that the deformation inducing shaft 140 perform a function of a lever in a form of a column or a wall as the user applies pressure to the housing 51, it is irrelevant even if the deformation inducing shaft 140 is made of an insulator. However, since the structure of the deformation inducing shaft 140 must be maintained despite the pressure applied thereto and the deformation of the housing 51, it is desirable to form the deformation inducing shaft 140 of a material having high strength. In addition, since the deformation inducing shaft 140 is a component installed in the electronic device 10, it may be desirable to use a lightweight material for the deformation inducing shaft 140.

Referring to FIG. 9A, the housing 51 may be divided into a first region R1 and a second region R2 based on a contact point with the deformation inducing shaft 140. The first region R1 may be one region of the housing 51 corresponding to an internal region in which the first sensing coil 111 is installed. That is, the first sensing coil 111 may be disposed below the first region R1 of the housing 51. In this case, the first region R1 and the first sensing coil 111 may be spaced apart to have an air gap therebetween having a length d4.

In addition, the second region R2 may be one region of the housing 51 corresponding to an inner region in which the first sensing coil 111 is not installed, based on the deformation inducing shaft 140. That is, the first sensing coil 111 may not be disposed directly below the second region R2 of the housing 51.

The second region R2 may be determined as a touch switch portion TSW. That is, touch sensing device 100 may detect that a force input is normally applied, when pressure, greater than a reference value is applied to the second region R2. Since the second region R2 is determined as a touch switch portion TSW as described above, to the touch sensing device 100-5 of FIG. 9A is associated with using a reverse sensing algorithm, which will be described below.

When the distance between the housing 51 and the first sensing coil 111 increases, the touch sensing device 100-5 may determine that external pressure is normally applied to the touch switch portion TSW. That is, the method by which the touch sensing device 100-5 determines that external pressure is normally applied to the touch switch portion TSW is in contrast to a method in which a conventional touch sensor detects that the distance between the housing 51 and the touch sensing device 100 (FIG. 2A) decreases.

In addition, since an inverse-detection algorithm detecting an increase in a distance between the housing 51 and the first sensing coil 111, can be effectively used, it is possible to compensate for malfunctions frequently occurring in a touch sensor.

The electronic device 10 according to the embodiment illustrated in FIG. 9A includes the first region R1 as a malfunction portion and the second region R2, excluding the first region R1, as a touch switch portion TSW. Therefore, when a user applies pressure exceeding a reference value to the first region R1, the pressure applied to the first region R1 may be determined as a malfunction by the touch sensing device 100-5. Conversely, when a user applies pressure exceeding a reference value to the second region R2, the pressure applied to the second region R2 may be determined as a normal force touch input by the touch sensing device 100-5, and may generate by a normal operation signal.

Referring to FIGS. 9A and 9B together, when external pressure F is applied to the second region R2 of the housing 51, deformation of the housing 51 may occur. That is, the second region R2, a point to which pressure is directly applied, may be bent inwardly (downwardly in FIG. 9B).

In this case, since the deformation inducing shaft 140 serves as a lever, an opposite point, symmetric to the point at which pressure is applied based on the deformation inducing shaft 140, may be bent outwardly (upwardly in FIG. 9B). Accordingly, the first region R1 of the housing 51 is farther from the first sensing coil 111 than before the deformation.

Comparing FIG. 9A, which illustrates a state before deformation, and FIG. 9B, which illustrates a state after deformation, it can be confirmed that the second region R2 of the housing 51 is deformed by external pressure F, such that a length of an air gap between the housing 51 in the second region R2 and the lower frame 60 is reduced from d6 to d1. Alternatively, it can be confirmed that the first region R1 of the housing 51 is bent outwardly by the deformation inducing shaft 140, so that the length of the air gap between the first sensing coil 111 and the housing 51 in the first region R1 increases from d4 to d41.

As described above, since the second region R2 is determined as the touch switch portion TSW, FIG. 9B corresponds to a case in which the user applies pressure to the touch switch portion TSW. That is, since the user applies pressure to the second region R2, and the distance between the first region R1 and the first sensing coil 111 increases, when external pressure is applied to the touch switch portion TSW, a vertical distance by which the housing 51 is spaced apart from the sensing coil 111 in the region R1 may increase.

In addition, the touch sensing device 100-5 may determine that external pressure is normally applied to the touch switch portion TSW when the distance between the housing 51 and the touch sensing device 100-5 increases. Therefore, the touch sensing device 100-5 may generate a normal force input signal, when the air gap of the first region R1 increases, as illustrated in FIG. 9B.

Further, when external pressure F is applied to the first region R1 of the housing 51 in the embodiment illustrated in FIG. 9B, the first region R1 is bent inwardly (downwardly in FIG. 9B). Accordingly, the first region R1 of the housing 51 is closer to the first sensing coil 111 than before the deformation.

As described above, since the first region R1 is determined as a malfunctioning portion, the touch sensing device 100-5 may determine that the corresponding pressure is not a normal force input applied to the touch switch portion TSW, when the air gap of the first region R1 decreases. That is, the external pressure F applied to the first region R1 may be determined as a malfunction that is not intended by the user. Therefore, the malfunction of the sensor can be minimized by adding the deformation inducing shaft 140.

Referring to FIG. 9B, the elastic member 150 may be compressed as pressure is applied to the second region R2 of the housing 51. Accordingly, the second sensing coil 112 may descend together with the support member 130, and the distance between the second sensing coil 112 and the lower frame 60 may be reduced from d5 to d51.

The decrease in the distance between the second sensing coil 112 and the lower frame 60 may cause a change in inductance of the second sensing coil 112, so that the application of external pressure can be detected. However, in the embodiment illustrated in FIG. 9A, an increase in the distance between the first sensing coil 111 and the housing 51 is detected as a normal force input, since the configuration of the deformation inducing shaft 140 is added.

Therefore, if such a reverse-detection method is applied consistently, the touch sensing device 100-5 recognizes a malfunction when the distance between the second sensing coil 112 and the lower frame 60 decreases. That is, there may be a problem in which the sensing results according to the first sensing coil 111 and the second sensing coil 112 are inconsistent with each other for the same force input.

Accordingly, in the structure in which the deformation inducing shaft 140 is added as illustrated in FIG. 9A, the first sensing coil 111 and the second sensing coil 112 may be respectively connected to separate sensing circuit units 201 and 202. That is, as illustrated in FIG. 5, and as described above, the first sensing coil 111 may be connected to the first sensing circuit unit 201, and the second sensing coil 112 may be connected to the second sensing circuit unit 202.

In this example, the first sensing circuit unit 201 may perform touch sensing according to the above-described inverse-detection algorithm, and the second sensing circuit unit 202 may be implemented to perform touch sensing according to a conventional algorithm. That is, the second sensing circuit unit 202 may detect a normal touch input when a distance between the second sensing coil 112 and the lower frame 60 is decreased. Then, by the same operation in which the pressure is applied to the touch switch portion TSW, the change in inductance according to the first sensing coil 111 and the second sensing coil 112 may exhibit sensing results that are consistent with each other.

As set forth above, according to embodiments disclosed herein, a touch sensing device and an electronic device may detect external pressure applied to the electronic device without a mechanical switch protruding outwardly of the electronic device.

Accordingly, a touch switch integral with an external case may be provided, durability of the electronic device may be improved, and space utilization and dustproofing and waterproofing effects may be improved.

In addition, according to embodiments disclosed herein, an amount of change in inductance generated in a sensing coil compared to the change in unit spacing between a housing and the sensing coil may be increased, and thus the sensing sensitivity of a touch sensor may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device, comprising:
a first sensing coil having conductivity;
a second sensing coil having conductivity;
a structure including a support member and a substrate having a space accommodating either one or both of the first sensing coil and the second sensing coil, wherein at least a portion of the substrate is disposed between the first sensing coil and the second sensing coil; and
an elastic member configured to be compressed as external pressure is applied and the structure descends to sense external pressure.

2. The touch sensing device of claim 1, wherein the support member is disposed to extend parallel to the substrate, and fixes the substrate.

3. The touch sensing device of claim 2, wherein at least a portion of the support member is recessed, and the substrate is fixed at a position including the recessed portion of the support member, and
wherein the second sensing coil is disposed on one surface of the substrate, and is disposed in the recessed portion of the support member.

4. The touch sensing device of claim 2, further comprising at least one pair of support-connecting members disposed such that one end of each of the support-connecting members is bonded to the support member, and the support-connecting members extend perpendicular to the support member,
wherein the first sensing coil and the second sensing coil are disposed between the at least one pair of support-connecting members.

5. The touch sensing device of claim 4, wherein at least a portion of the elastic member is disposed to overlap in at least a portion of the at least one pair of support-connecting members in a vertical direction.

6. The touch sensing device of claim 1, wherein the first sensing coil is disposed on one surface of the substrate, and the second sensing coil is disposed on another surface of the substrate, and
wherein the first sensing coil and the second sensing coil are electrically connected to each other.

7. The touch sensing device of claim 1, wherein the first sensing coil is disposed on one surface of the substrate, and the second sensing coil is disposed on another surface of the substrate, and
wherein the first sensing coil and the second sensing coil are disposed such that respective winding shafts of the first sensing coil and the second sensing coil are arranged to be staggered with respect to each other.

8. The touch sensing device of claim 1, wherein the first sensing coil and the second sensing coil are disposed on a same surface of the substrate, and
wherein the substrate is bent such that the first sensing coil and the second sensing coil face each other.

9. An electronic device, comprising:
a housing including a touch switch portion in at least a portion of the housing;
a lower frame spaced apart from a lower surface of the housing; and
a touch sensing device disposed between the housing and the lower frame, and configured to sense external pressure applied to the touch switch portion,
wherein the touch sensing device comprises:
a first sensing coil having conductivity;
a second sensing coil having conductivity;
a substrate having a space accommodating either one or both of the first sensing coil and the second sensing coil, wherein at least a portion of the substrate is disposed between the first sensing coil and the second sensing coil; and
a support-connecting member supporting the housing such that the substrate descends as external pressure is applied to the touch switch portion.

10. The electronic device of claim 9, further comprising a sensing circuit unit electrically connected to the substrate, and configured to generate information of the external pressure, based on a sum of a change in inductance of the first sensing coil and a change in inductance of the second sensing coil.

11. The electronic device of claim 9, wherein the housing and the lower frame are connected to each other at locations disposed around the first sensing coil and the second sensing coil.

12. The electronic device of claim 9, wherein the touch sensing device further comprises a support member disposed to extend parallel to the substrate, and fixing the substrate.

13. The electronic device of claim 12, wherein at least a portion of the support member is recessed, and the substrate is fixed at a position including the recessed portion of the support member, and
wherein the second sensing coil is disposed on one surface of the substrate, and is disposed in the recessed portion of the support member.

14. The electronic device of claim 13, wherein the support-connecting member comprises at least one pair of support-connecting members disposed such that one end of each of the support-connecting members is bonded to the support member, another end of each of the support-connecting members is bonded to the housing, and the support-connecting members extend perpendicular to the support member, and
wherein the first sensing coil and the second sensing coil are disposed between the at least one pair of support-connecting members.

15. The electronic device of claim 9, further comprising an elastic member disposed between the lower frame and the substrate.

16. The electronic device of claim 9, wherein the first sensing coil is disposed on one surface of the substrate, and the second sensing coil is disposed on another surface the substrate, and
wherein the first sensing coil and the second sensing coil are electrically connected to each other.

17. The electronic device of claim 9, wherein the first sensing coil is disposed on one surface of the substrate, and the second sensing coil is disposed on another surface of the substrate, and
wherein the first sensing coil and the second sensing coil are disposed such that respective winding shafts of the first sensing coil and the second sensing coil are arranged to be staggered with respect to each other.

18. The electronic device of claim 9, wherein the first sensing coil and the second sensing coil are disposed on a same surface of the substrate, and
wherein the substrate is bent such that the first sensing coil and the second sensing coil face each other.

* * * * *